United States Patent [19]

Maass et al.

[11] Patent Number: 5,031,138

[45] Date of Patent: Jul. 9, 1991

[54] IMPROVED RATIO DECODER FOR USE IN A NON-RESTORING BINARY DIVISION CIRCUIT

[75] Inventors: Klaus K. Maass; David T. Shen, both of Poughkeepsie, N.Y.

[73] Assignee: International Business Machines Corporation, Armonk, N.Y.

[21] Appl. No.: 532,729

[22] Filed: Jun. 4, 1990

[51] Int. Cl.⁵ ............................................. G06F 7/52
[52] U.S. Cl. ................................................... 364/767
[58] Field of Search ............... 364/761, 762, 763, 764, 364/765, 766, 767; 341/62, 84, 85

[56] References Cited

U.S. PATENT DOCUMENTS

| | | | |
|---|---|---|---|
| 3,591,787 | 1/1968 | Freiman et al. | 235/164 |
| 3,621,218 | 12/1971 | Nishimoto | 235/164 |
| 3,852,581 | 12/1974 | Reynard et al. | 235/164 |
| 4,722,069 | 1/1988 | Ikeda | 364/767 |

OTHER PUBLICATIONS

IBM Technical Disclosure Bulletin, vol. 23, No. 8, 1/81, pp. 3811-3814, entitled "4-2 Carry-Save Adder Module" by A. Weinberger.
IBM Technical Disclosure Bulletin, vol. 20, No. 8, 2/78, pp. 3594-3597, entitled "4-2 Carry-Save Adder Implementation Using Send Circuits", by D. T. Shen and A. Weinberger.
IBM Technical Disclosure Bulletin, vol. 14, No. 11, 4/72, pp. 3279-3281, entitled "Uniform 2 Bits Quotients Binary Division by Carry-Save Adders", by K. G. Tan.

Primary Examiner—Dale M. Shaw
Assistant Examiner—Long T. Nguyen
Attorney, Agent, or Firm—Richard M. Ludwin

[57] ABSTRACT

An essentially symmetrical ratio decoder which covers all areas in both the positive and negative regions with only a small number of noted exceptions. Multiple boundaries were selected such that the positive and negative regions were symmetrical with only a small number of exceptions. Using these boundaries, an essentially symmetrical, unified ratio decoder was constructed using only about one-half of the integrated circuit real estate of conventional ratio decoder pairs. By decoding the sign bit from the ratio decoder adder, the ratio decoder recognizes the exceptional areas and handles them accordingly.

9 Claims, 11 Drawing Sheets

FIG. 6

$M_0 = \bar{a} \, b \, \bar{c} \, \bar{d} + \bar{a} \, \bar{b} \, \bar{c} \, x(\bar{e} + \bar{f}) + \bar{a} \, b \, \bar{c} \, e \, y \, z + \bar{a} \, \bar{b} \, \bar{c} \, \bar{e} \, f(x + y + z)$ $\quad + \bar{a} \, \bar{b} \, c \, e \cdot \text{sumbit}\emptyset = 1 \cdot y + \bar{a} \, \bar{b} \, c \, \bar{e} \, \bar{f} \cdot \text{sumbit}\emptyset = 1$ $M_2 = a + b \, c + b \, e \, \bar{x} + b \, f \, \bar{x} + b \, d \, e \, f + b \, d \, (\bar{x} + \bar{y}) + b \, d \, e \, (\bar{y} + \bar{z}) + c \, d \, e \, f \, (x + \bar{y}) + c \, d \, e \, \bar{x} \, y \, \bar{z} + c \, d \, f \, \bar{x} \, y \, z + c \, d \, e \, f \, x \, y$ $\quad + b \, e \, f \, \bar{y} \, z + b \, \bar{x} \, (\bar{y} + \bar{z}) + c \, d \, e \, \bar{x} \, \bar{y} \, z + c \, d \, e \, f \, \overline{\text{sumbit}\emptyset = 1} \, \bar{x} \, \bar{y} \, \bar{z} + c \, d \, e \, \bar{x} \, (\bar{y} + \bar{z}) + c \, d \, e \, \overline{\text{sumbit}\emptyset = 1} \, \bar{x} \, y$ $\quad + c \, d \, \overline{\text{sumbit}\emptyset = 1} \, \bar{x} \, \bar{y} \, \bar{z} + c \, d \, e \, f \, \overline{\text{sumbit}\emptyset = 1}$ $M_1 = \bar{M}_0 \cdot \bar{M}_2$ sumbit $\emptyset = 1$ INDICATES A NEGATIVE SUM

IMPROVED RATIO DECODER FOR USE IN A NON-RESTORING BINARY DIVISION CIRCUIT

BACKGROUND OF THE INVENTION

1. Field of the Invention

This invention relates to binary division. More particularly, this invention relates to binary division of the type that is accomplished by repeated subtraction using multiples of the divisor.

2. Related Art

Binary division, as performed by digital computers, has been conventionally accomplished by iteratively subtracting multiples of the divisor from a partial dividend. By performing division in such a manner, multiple bits of the quotient can be developed in each iteration, thus saving a significant number of machine cycles over the course of a divide operation.

In a typical divide iteration, the following operation is performed:

$$Rn = PDn - Mn*D$$

where $R_n$ = remainder at the end of iteration n
$PD_n$ = partial dividend at the start of iteration n
$D$ = divisor ($\frac{1}{2} \leq D \leq 1$)
$M_n$ = divide multiple used in iteration n
(An "*" indicates multiplication)

For a 2-bit divide, $PD_{n+1} = 4*R_n$ (left shift of two bits). If $M_n$ is restricted to the values $-2, -1, 0, +1, +2$ then, $$|R_n/D| \leq \tfrac{2}{3}, \text{ or } |PD_n/D - M_n| \leq \tfrac{2}{3}$$

Therefore, once the ratio of $PD_n/D$ is know, the divide multiple $M_n$ can be determined by Table I:

TABLE I

| $X_n = PD_n/D$ | $M_n$ |
|---|---|
| $4/3 \leq X_n \leq 8/3$ | 2 |
| $\tfrac{1}{3} \leq X_n \leq 5/3$ | 1 |
| $-\tfrac{2}{3} \leq X_n \leq \tfrac{2}{3}$ | 0 |
| $-5/3 \leq X_n \leq -\tfrac{1}{3}$ | $-1$ |
| $-8/3 \leq X_n \leq -4/3$ | $-2$ |

Further, $Q_n$ can be determined by the relationships of Table II:

TABLE II

| $M_n$ | $Q_n(R_n > \text{ or } = 0)$ | $Q_n(R_n < 0)$ |
|---|---|---|
| 2 | 2 | 1 |
| 1 | 1 | 0 |
| 0 | 0 | 3 |
| $-1$ | 3 | 2 |
| $-2$ | 2 | 1 |

As indicated above, a typical divide operation will include two serial operations: 1) determine $M_n$ from $PD_n/D$; 2) determine $R_n$ by $R_n = PD_n - M_n*D$. In prior techniques it has been shown that $M_{n+1}$ can be generated in parallel with $R_n$. Hence, the iteration time is limited by generating $R_n$. Conventionally, $M_n$ is determined by providing both $PD_n$ and $D$ to decoders (one for negative $PD_n$ values and a separate decoder for positive $PD_n$ values) and determining $M_n$ by using look up tables.

To determine $M_n$, only the high-order bits of $PD_n$ and $D$ are needed. Since $PD_n = 4R_{n-1} = 4(PD_n-1 - M_{n-1}*D)$, the higher order bits of $PD_n$ (designated $PD_n'$) can be generated in parallel with $PD_n$ from the higher order bits of $PD_{n-1}$ and $M_{n-1}*D$. The $PD_n'$ so generated ignores the carry-in from the lower order bits. This error can be compensated for by selecting the multiple boundary in the overlapped region between the multiples. Since:

$$PD_{n-1} = 4R_{n-2} = 4(PD_{n-2} - M_{n-2}*D)$$

then:

$$PD_n = 4R_{n-1} = 4(PD_{n-1} - M_{n-1}*D)$$
$$= 4[4(PD_{n-2} - M_{n-2}*D) - M_{n-1}*D]$$

Therefore, the high-order bits of $PD_n$ ($\widetilde{PD}_n$), and hence $M_n$, can be determined from $PD_{n-2}$, $M_{n-2}$, and $M_{n-1}$.

The quotient bits $Q_n$ (2 bits per iteration) are determined by the relations:

$$Q_n = M_n \text{ if } C_n = 1, \quad Q_n = M_n - 1 \text{ if } C_n = 0$$

where $C_n$ is a carry out bit indicative of the sign of the remainder ($R_n$).

An example of an apparatus for performing non-restoring division and embodying the foregoing principles is illustrated in FIG. 1. FIG. 1 depicts a fixed point binary divider 100. Data locations refer to the start of the nth iteration. The remainder from the previous iteration n−1 is latched into the remainder latch 102 of the carry propagate adder 104. The last carry (off the end of the remainder) is used by the quotient generator 106 to generate $Qn-1$, since $Qn-1 = Mn-1 - Cn-1$, where $Cn-1$ represents the last carry that occurred. $Cn-1$ indicates the sign of $Rn-1$ (1 if negative, 0 if positive) and is generated by counting carries out of the carry propagate adder 104. This covers the case where $Qn-1 = Mn-1 -1$. $Mn-1$ is represented by two's compliment form in the multiple latches 108. The quotient generator 106 is a two-bit down counter and binary trigger.

The last remainder $Rn-1$ wraps back on the carry propagate adder 104 through a two-bit wired left shift 110 to become $PDn$. $Mn*D$ feeds the other side of the carry propagate adder from the multiple gates 112. The multiple gates form 1X or 2X divisor multiples in true or compliment form from the divisor register 114 as selected by the multiple select lines 116. The multiple select lines generate the extra carry into the adder (hot one) when a two's compliment divisor is selected.

The last remainder (left shifted by 2 bits) also feeds the ratio decoder adder 118 which resolves its high order bits, along the high order bits of $Mn*D$ into the high order bits of $Rn$. The high order bits of $Rn$, shifted left by two bits to form $PDn+1$, feed two ratio decoders 120, 122 that select a positive and negative $Mn+1$ from the ratio of $PDn+1$ to the divisor D. The carry-out of the multiple decoder adder indicates the sign of $PDn+1$, and is used to select the opposite signed $Mn+1$ from the multiple latch drivers 124. The selected $Mn+1$ is then latched into the quotient multiple latches 108 and is ready for the next iteration.

In the divider of FIG. 1, the sign of $Rn-1$ is formed by counting the carries out of the carry propagate adder with a binary trigger, and the sign of $PDn+1$ is formed by waiting for the carry out of the decoder adder 118. In any event, either method can be used as determined by the adder organization. The initial dividend is not shown in FIG. 3. A typical hardware saving location for the initial dividend is the quotient register 126 (by time-sharing).

As explained above, two ratio decoders are provided. A positive ratio decoder 120 and a negative ratio decoder 122. The two separate decoders are provided because the positive and negative regions are not completely symmetrical. That is to say, for a given divisor, the proper value of Mn where the partial dividend PDn is positive will not necessarily be the same as where the partial dividend PDn is of the same magnitude but negative. This principle is illustrated in the charts of FIGS. 2A and 2B.

Horizontally on each chart are plotted partial dividend values in sixteenths while divisor values are plotted vertically in sixteenths. The chart of FIG. 2A represents positive partial dividends and the chart of FIG. 2B represents negative partial dividends.

Within each chart there are four slanted lines referred to as exact "boundaries." The exact boundaries 202–216 represent the four possible ratios of PDn/D which are of interest in decoding Mn and were taken from Table I. The crooked lines 218, 220 near the ⅔ and 5/3 exact boundaries represent the nearest integer ratio whose magnitude is less than or equal to the exact ratio. In the decoder adder 118, PD and D are represented to a bit position weight of 64 (thus the low order bit of PDn+1 as available to the decoder has a weight of sixteen). Thus each square on the chart represents a possible ratio between $PD_{n+1}$ and D which can be seen by the ratio decoders.

The positive and negative regions as delimited by the integer boundaries are not symmetrical. The negative region really shows the 1's compliment form of the partial dividend and is therefore off by one bit. The boundary regions, however, where two multiples overlap are equal in the positive and negative region.

In the chart for the positive partial dividends, the point in the upper left corner of each square represents the bit patterns of $PD_{n+1}$ and D, while the exact ratio of that particular $PD_{n+1}$ to D is represented by any point within the square or on its upper or left boundary.

Overlap of multiple ranges for some values of PDn/D (see the bottom of FIG. 2) permits some flexibility in choosing the decode boundary for a particular multiple. However, much of the flexibility is lost because of the error introduced by ignoring the carry into the lowest bit position of $PD_n$ in the decoder adder 118. For example, the positive decoder 120 for multiple zero must select on all bit patterns of $PD_n$ and D as represented by squares to the left or cut by the one-third exact boundary. A line which is drawn through the right most extreme of these squares would be referred to as the one-third integer boundary. Because of the overlap in the range for selection of $M_n=0$ and $M_n=1$, the decoder for $M_n=0$ could select on any square between the one-third and two thirds boundaries. But because the carry-in error may permit $PD_n$ to be low by one bit, the multiple zero decoder may not select on any square which is just to the left of the two thirds integer boundary. The dashed lines represent the left edge of those squares whose bit patterns are decoded to select $M_n=1$. The remaining squares in the upper range are then decoded to select $M_n=2$.

The negative ratio decoder 122 (the decoder for negative partial dividends) is derived in a similar manner. The truncation and carry-in errors in this case are toward the zero partial dividend so that the point at the upper left corner of each square represents the bit pattern seen by the decoder. The dashed lines represent the left edges of the squares selected for $Mn=-1$. The $Mn=0$ line is shown to imply the right edge for $Mn=-1$.

In the ratio decoders 120, 122 and the tables of FIG. 2, the variables are defined as divisor=0,1xyz and partial dividend=ab.cdef.

While the divider of FIG. 1 has provided a successful mechanism for performing non-restoring binary division it does have a number of features which are open for improvement. For example, having separate decoders for the positive and negative partial dividend regions does not make for an efficient integrated circuit real estate. Further, in some instances, the implementation of these decoders can create engineering limitations on the speed of division.

II. SUMMARY OF THE INVENTION

The inventors have discovered that multiple boundaries can be selected such that the positive and negative regions are symmetrical with only a small number of exceptions. Using these boundaries, an essentially symmetrical, unified ratio decoder was constructed using only about one-half of the integrated circuit real estate of conventional ratio decoder pairs. By decoding the sign bit from the ratio decoder adder, the ratio decoder can recognize the exceptional areas and handle them accordingly.

III. BRIEF DESCRIPTION OF THE DRAWINGS

The present invention will be better understood by reference to the drawings, wherein:

FIG. 6 is an illustration of the logic equations embodied in the symmetrical ratio decoders of FIGS. 3 and 7A/B;

Like components appearing in more than one figure are designated by like reference numerals.

DESCRIPTION OF THE PREFERRED EMBODIMENTS

Described herein are A) an essentially symmetrical ratio decoder which symmetrically covers all areas in both the positive and negative regions with only a small number of exceptions; B) an improved divider using symmetrical ratio decoders; C) divide and convert to binary circuits using a common data path to halve execution time; and, D) a reduced execution time convert to binary circuit using carry save adders and carry propagate adders.

A. Symmetrical Ratio Decoder For Binary Division

The present section describes an essentially symmetrical ratio decoder which symmetrically covers all areas in both the positive and negative region with only a small number of noted exceptions. By using this essentially symmetrical ratio decoder, the need for separate positive and negative decoders is eliminated and a significant amount of integrated circuit real estate is saved in both the decoder and the binary divider.

Figure 3:
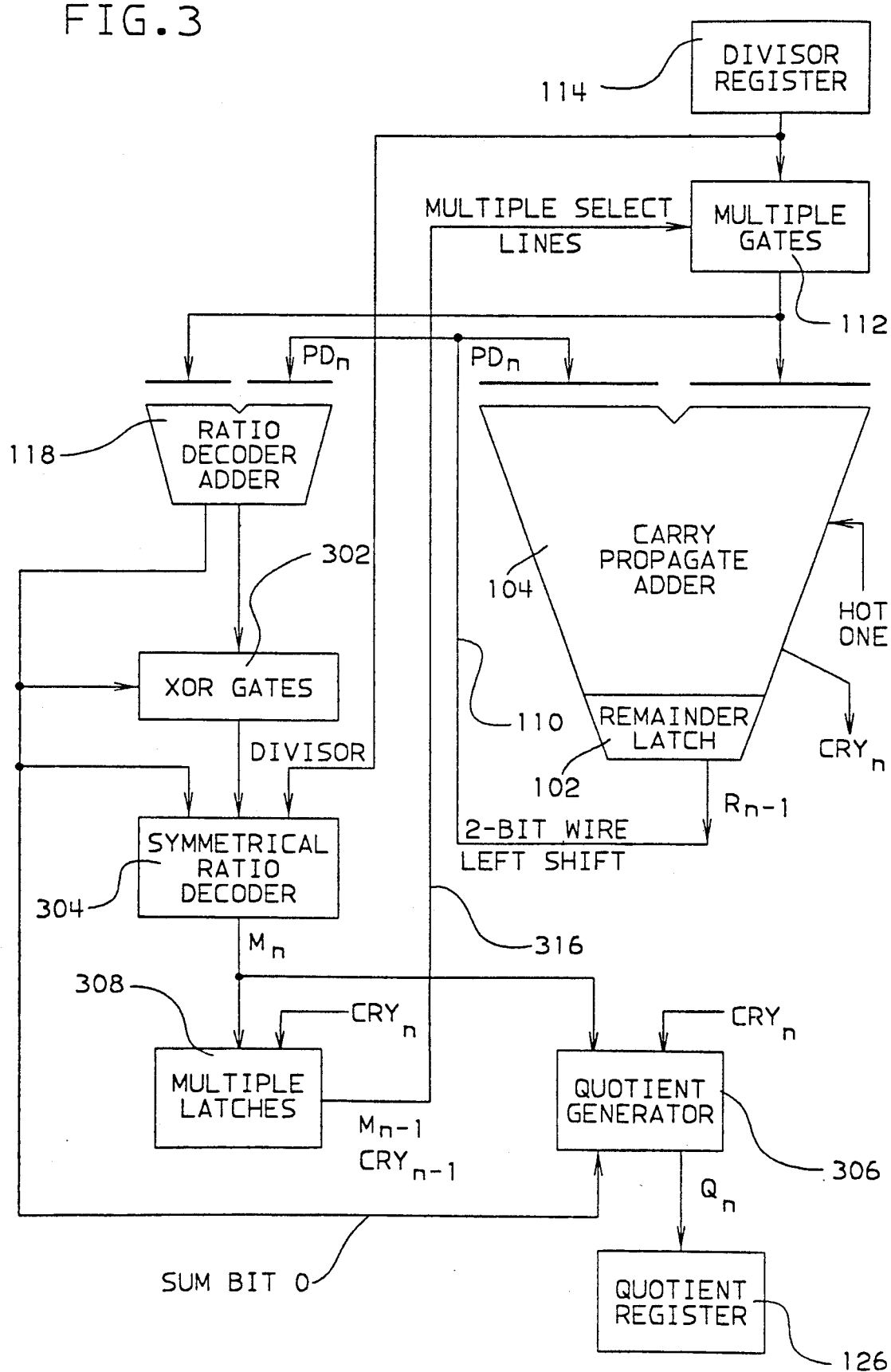
FIG. 3 is an illustration of an improved binary divider having a symmetrical ratio decoder.

FIG. 3 is an illustration of a binary divider having a symmetrical ratio decoder. Like the divider of FIG. 1, the present divider includes a divisor register 114, multiple gates 112, a carry propagate 104, a remainder latch 102, a two bit wire shift left 110 to form PDn from $R_n-1$, a ratio decoder adder 118, and a quotient register 126. These components operate in the same manner as the like numbered components described with respect to FIG. 1.

Figure 7A:
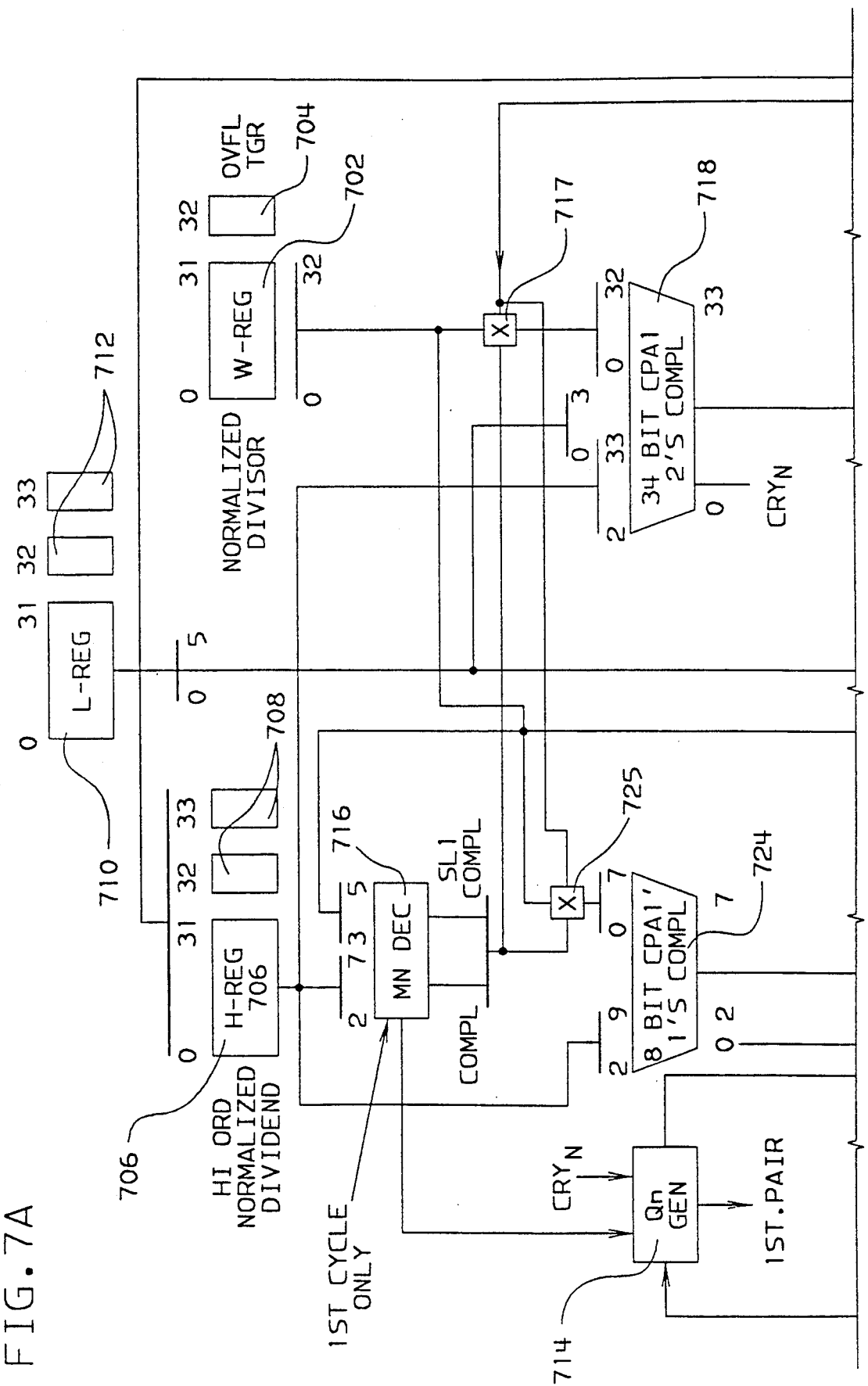
FIGS. 7A and 7B illustrate an embodiment of an apparatus for performing non-restoring division, which can generate four quotient bits per clock cycle.

The apparatus of FIG. 3 assumes that at the start of clock cycle n, an initial remainder $R_{n-1}$ is in the remainder latch 102, and an initial carry out and multiple ($CRY_{n-1}$ and $M_{n-1}$) are stored in the multiple latches 308. Actual start up will be discussed in more detail later, with respect to the embodiment of FIGS. 7A/7B.

Figure 1:
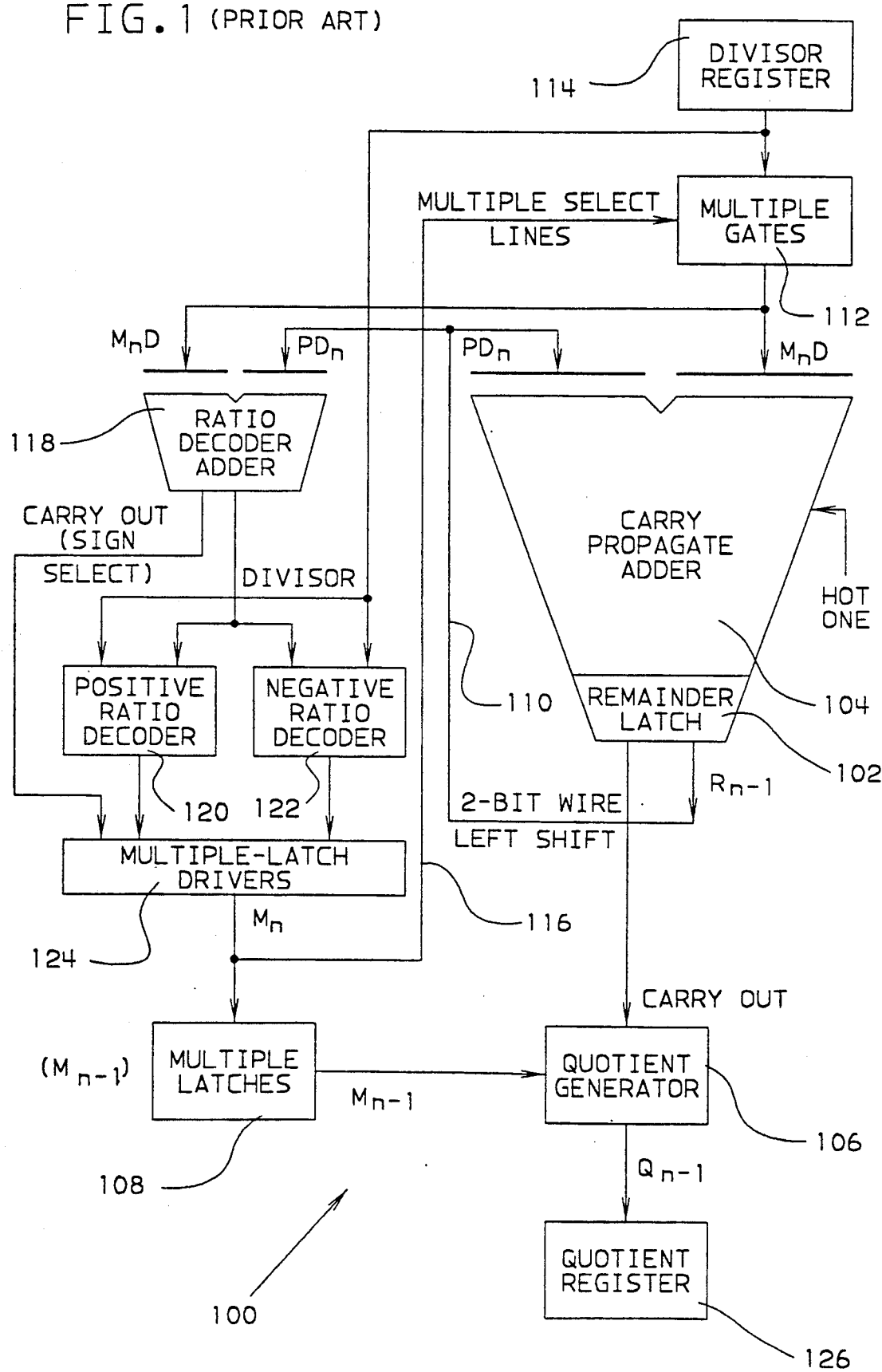
FIG. 1 is an illustration of the hardware organization of a prior art binary divider.

In contrast to the binary divider of FIG. 1, the present divider eliminates the positive and negative ratio decoders 120, 122 and the multiple latch drivers 124. Instead, the six lower order bits from the ratio decoder adder are provided to the Exclusive-OR gates 302, wherein each of the six bits is exclusive ORed with the most significant bit (bit 0) from the ratio decoder adder 118. In this manner, the six lower order bits of the sum S' from the ratio decoder adder 118 are fed to the ratio decoder 304 in true form when the MSB is zero (positive remainder) and in 1's compliment form when the MSB is a one (negative remainder). Throughout the remainder of this specification the most significant bit (MSB) of the result from any ratio decoder adder will be referred to as sumbit0.

In addition to receiving the output of the Exclusive-OR gates (the lower order six bits of S' or the 1's compliment thereof), the symmetrical ratio decoder 304 receives the divisor D and sumbit0 from the ratio decoder adder 118. It should be understood that the symmetrical ratio decoder 304 of FIG. 3 is not simply a combination of the positive and negative decoders 120, 122 of FIG. 1. While such a combination could be achieved by merely combining the positive and negative region decode logic into a single large decoder and additionally decoding the most significant bit from the ratio decoder adder, this alone would not accomplish the goal of saving circuitry and integrated circuit real estate.

Advantageously, the symmetrical decoder of FIG. 3 uses a single combined region, defined by appropriately choosing the multiple boundaries, to handle both positive and negative partial dividend values. By using the most significant bit from the ratio decoder adder to 1's compliment negative partial dividends, the symmetrical ratio decoder 304 decodes all partial dividends as though they were positive and uses the most significant bit from the ratio decoder adder to resolve the ambiguous cases. The carry out from the carry propagate adder 104 can be used to select whether the $M_n*D$ result is to be added to or subtracted from the divisor (i.e. no carry=add, carry=subtract).

Figure 4:
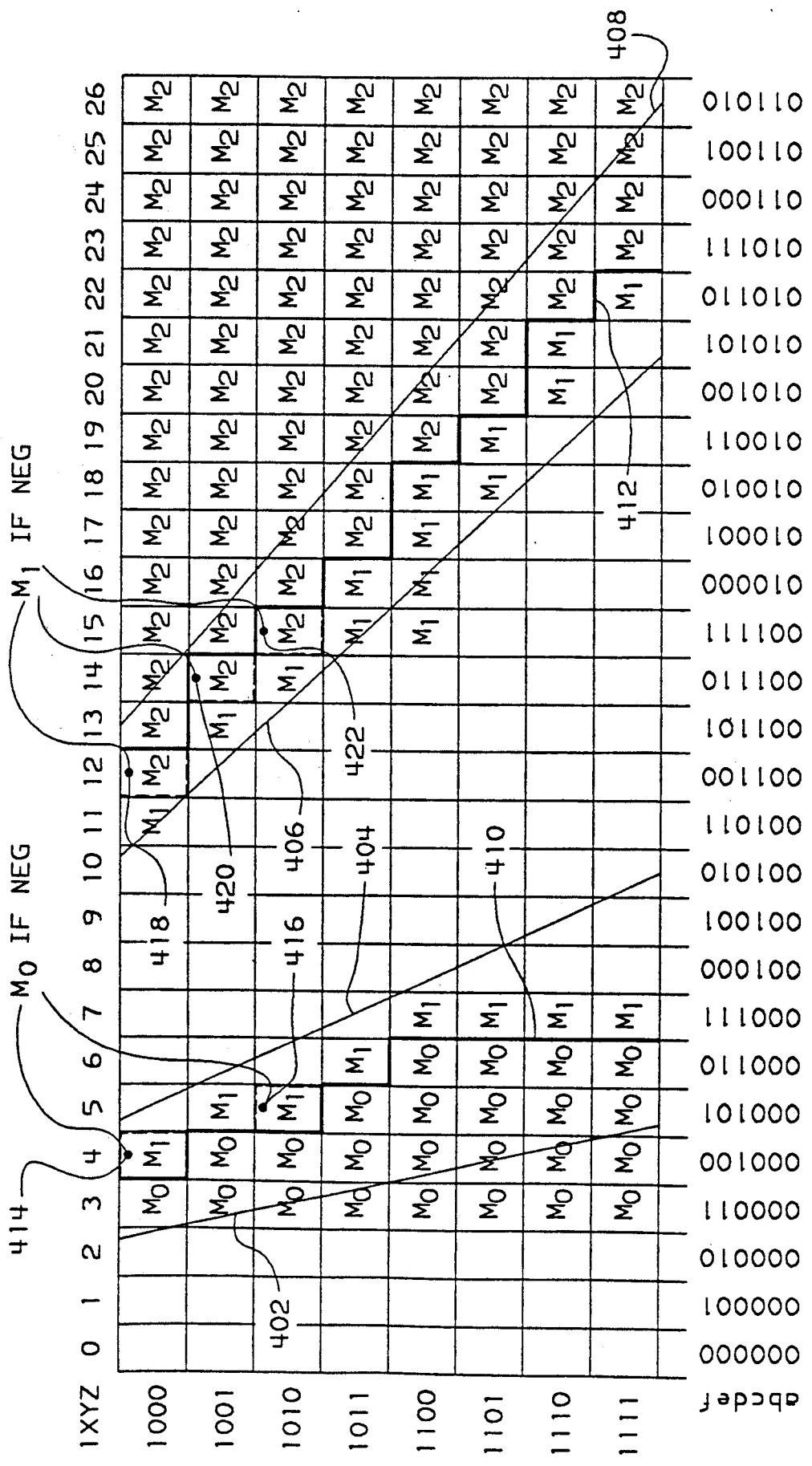
FIG. 4 is a chart illustrating the boundary regions for an embodiment of the symmetrical ratio decoders of FIGS. 3 and 7A/B.

The operation of the symmetrical ratio decoder of FIG. 3 will be better understood by reference to FIG. 4. FIG. 4 is a combined decode chart for both positive and negative ratios. In FIG. 4, the four slanted lines 402–408 represent, respectively, the integer boundaries for the $M_n=0 \ldots M_n=2$ regions. The multiple values are designated in shorthand form, wherein $M_n=0$ is designated M0, $M_n=1$ is designated M1 and $M_n=2$ is designated M2. The two crooked lines 410, 412, represent the boundaries selected by the inventors to achieve approximate symmetry. Specifically, the first crooked line 410, designates the selected boundary between $M_n=0$ and $M_n=1$. Similarly, the second crooked line 412, designates the selected boundary between $M_n=1$ and $M_n=2$.

By selecting the boundary regions as illustrated in FIG. 4, the inventors have configured the combined decode chart such that there are only five ambiguous decode ratios (two in the $M_n=1$ region and three in the $Mn=2$ region). These ambiguous ratios (designated by reference numerals 414–422) are recognized by the decoder 304 and handled appropriately by reference to the most significant bit from the output of the ratio decoder adder (sumbit0). Specifically, two of the areas 414, 416 in the $M_n=1$ region will decode Mn=0 only if they are partial dividends that were made positive by 1's complimenting (sumbit0=1). Otherwise, these areas 414, 416 will decode as $M_n=1$. Further, three areas 418, 420, 422 in the $M_n=1$ region will decode $M_n=2$ only if they are partial dividends that were not 1's complimented (sumbit0=0). Otherwise, these three areas will decode as $M_n=1$.

Figure 2A:
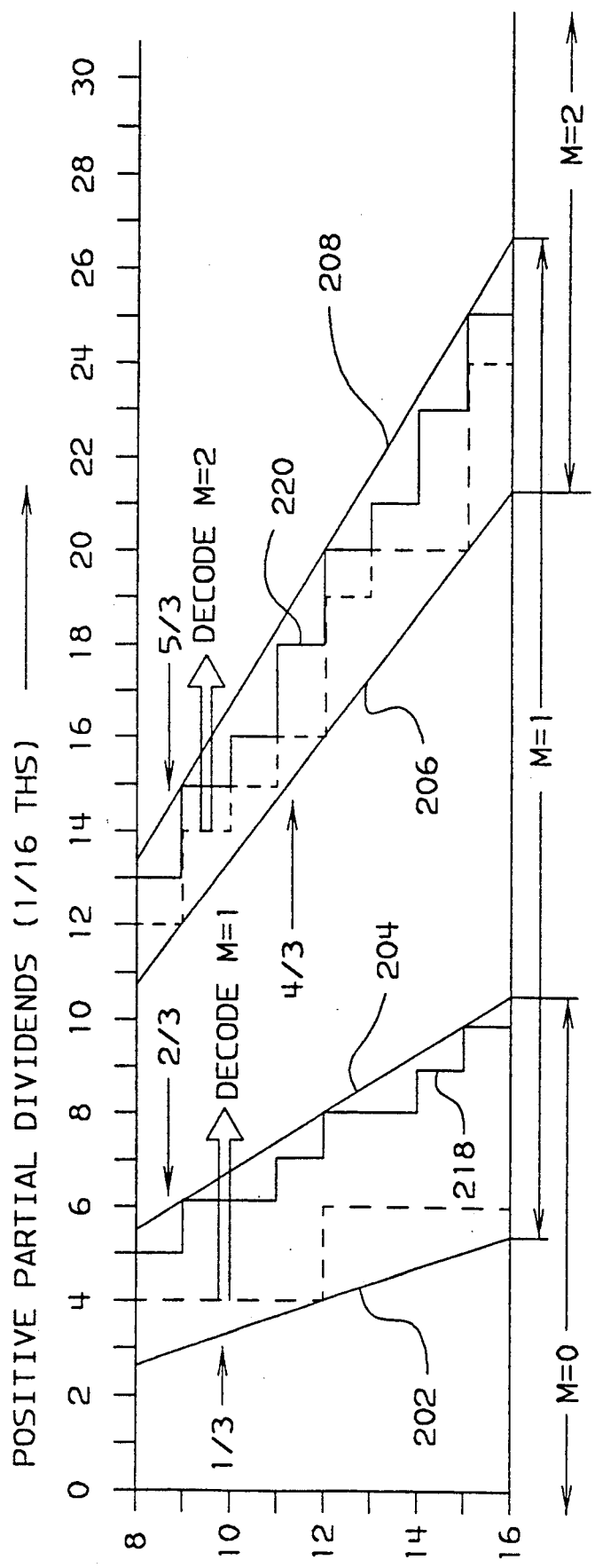
FIGS. 2A and 2B are charts illustrating partial dividend/divisor ratios, showing boundary regions for the ratio decoders. The chart of FIG. 2A represents positive partial dividends and the chart of FIG. 2B represents negative partial dividends.
Figure 2B:
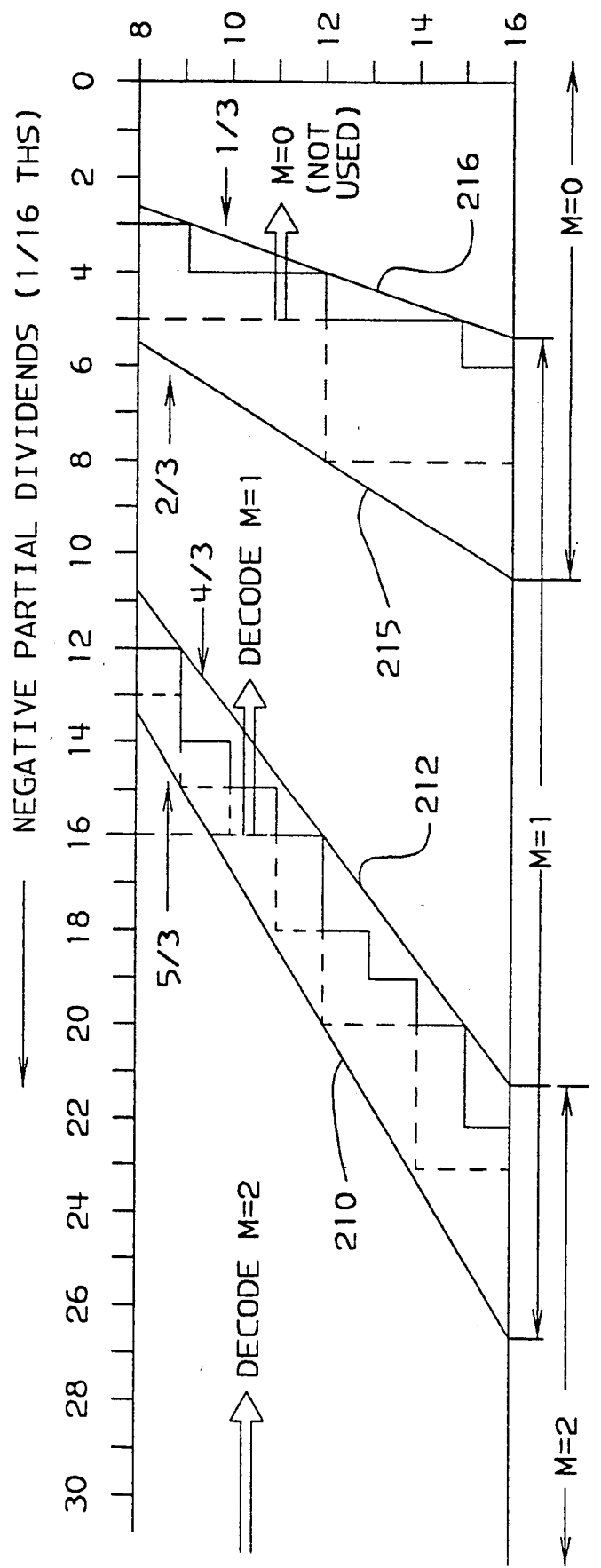

As an example, assume that the ratio decoder adder 118 (FIG. 2) has just subtracted a partial divisor of 8 ($M_{n-1}=1$, D=00001000 binary) from a partial dividend of 04 (00000100 binary). The ratio decoder 118 would accomplish the subtraction by adding the 1's compliment of the partial divisor to the partial dividend as illustrated below:

|  |
|---|
| 00000100 |
| + |
| 11110111 |
| 11111011 |

The six lower order bits of the result are sent to the XOR gates 302 where each bit is exclusively OR'ed with bit 0 from the ratio decoder adder. In this case, sumbit0 is a one, thus the result is 1's complimented and sent to the decoder as 00000100.

Turning again to FIG. 4, it will be observed that where the partial divisor is 1000, and six lower order bits (abcdef) of the partial dividend are 000100, the multiple $M_n$ for the next iteration could be either 1 or 0. By looking at sumbit0 from the output of ratio decoder adder 118, the ratio decoder establishes that the partial dividend became positive by taking the 1's compliment. Thus, the value $M_n=0$ is output as a result of the decode. Bit 1 is not needed because the result shifted left by 2 (SL2) is input the decoder 304.

Figure 5:
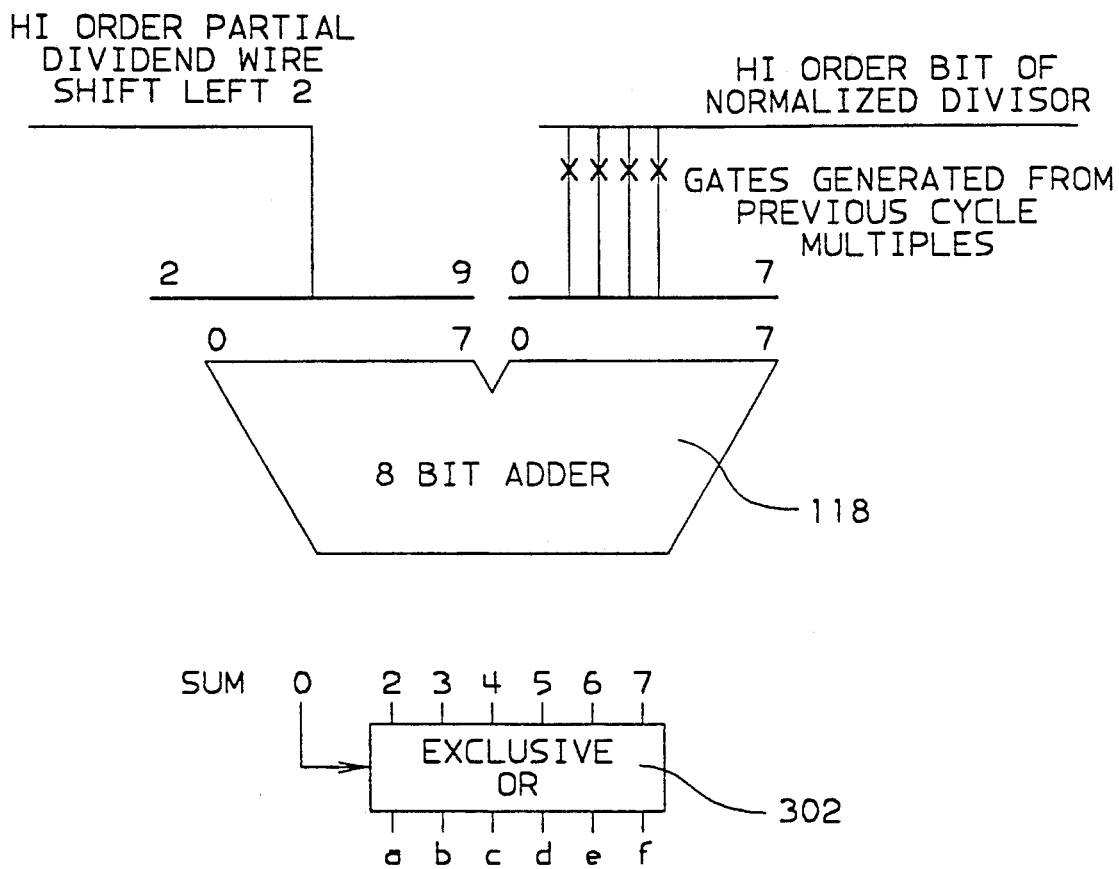
FIG. 5 is a more detailed diagram of the ratio decoder adder and the exclusive OR gates of FIG. 3.

FIG. 5 is a more detailed diagram of an embodiment of the adder and XOR sections of FIG. 3. As is illustrated in FIG. 5, where an eight bit adder is used as the ratio decoder adder 118, bit 1 is not fed to the ratio decoder, and bits 2 through 7 are individually exclusive OR'ed with sumbit0 before being sent to the ratio decoder.

FIG. 6 shows the logic equations embodied in the ratio decoder 304 where the partial remainder (the output of the XOR gates) is of the form abcdef and the divisor is of the form 1xyz. Sumbit0=0 indicates positive sum, while sumbit0=1 indicates a negative sign.

The operation of the embodiment of FIG. 3 will now be described in more detail. Again, we will assume that at the start of clock cycle n, an initial remainder $R_{n-1}$ is held in the remainder latch 102, and an initial carry out $CRY_{n-1}$ and multiple $M_{n-1}$ is held in the multiple latches 308. For purposes of the example, we will also assume a 34 bit initial remainder and a 32 bit divisor.

At the beginning of cycle n, the divisor D (from the divisor register 114) is applied to the multiple gates 312. The multiple gates 112 form 1X or 2X divisor multiples in true or compliment form as selected by the multiple select lines 316. The multiple select lines 316 carry the multiple $M_{n-1}$ and the carry out $CRY_{n-1}$ from the previous cycle. A carry out of one ($CRY_{n-1}=1$) causes the multiple gates 112 to output the 1's compliment of $M_{n-1} * D$. A no carry ($CRY_{n-1}=0$) causes the multiple gates 112 to output $M_{n-1} * D$ in true form.

The $M_{n-1} * D$ (in true or compliment form, as output from the multiple gates 112) is provided, in parallel, to the carry propagate adder 104 and to the ratio decoder adder 118. The carry propagate adder 104 forms the sum of the partial dividend $PD_n$ and the $M_{n-1} * D$ value output from the multiple gates. The $CRY_{n-1}$ (from the multiple select lines) generates a hot 1 into the CPA 104 when a complimented divisor multiple is selected ($CRY_{n-1}=1$). The resulting remainder $R_n$ is latched into the remainder latch 102. As illustrated in FIG. 3, the partial dividend $PD_n$ is formed by wire shifting $R_{n-1}$ to the left by two bit positions.

In parallel with the CPA 104, the ratio decoder adder forms the sum of the eight lower order bits of the partial dividend $PD_n$ and the $M_{n-1} * D$ value output from the multiple gates. The MSB (bit 0) of the sum is input to the XOR gates 302 and the symmetrical ratio decoder 304 which operate, as described above, to produce a multiple value $M_n$. The $M_n$ value, so generated is stored, along with the carry out $CRY_n$ from the CPA 104, in the multiple latches 308. The $M_n$ value, the carry out $CRY_n$, and sumbit 0 (from the ratio decoder) adder are also provided to the quotient generator 306.

Like the quotient generator 106 of FIG. 1, the quotient generator 306 of FIG. 3 uses the carry out $CRY_n$ from the carry propagate adder 104 to determine the quotient bits from the decoded multiple $M_n$. However, in the apparatus of FIG. 3, the symmetrical ratio decoder 304 provides only an absolute value of the decoded multiple. Thus, for example, where the result from the ratio decoder adder is negative, and the decoded multiple is M1, the ratio decoder will output $M_n=1$ (binary 01) whereas in fact, the proper multiple is $M_n=-1$ (binary 11).

To compensate for the fact that the decode multiple is provided in absolute value form, sumbit0 (sum bit0) from the ratio decoder adder is provided to the quotient generator 306. Since sumbit0 indicates the actual sign of the decoded multiple (sumbit0=1 indicates a negative multiple, sumbit0=0 indicates a positive multiple), the quotient generator uses this bit to adjust the decoded multiple value to reflect its proper sign. This is readily accomplished by 2's complimenting the decoded multiple when sumbit0=1. The carry out $CRY_n$ from the carry propagate adder 104 determines whether the quotient generated by the quotient generator is equal to the multiple $M_n$ or the multiple minus 1 ($M_n-1$). Where the carry out is equal to 1, the quotient $Q_n=(M_n-1)$. Where the carry out $CRY_n$ is equal to 0 (no carry) then $Q_n=M_n$.

Once determined, the quotient (2-bits) is put away in the quotient register 126 which fills up starting at the least significant two bits.

It should be understood that the foregoing principles can be used to devise symmetrical ratio decoders which generate more than two bits per decode. In such embodiments, the number of multiple regions would be increased as would the number of bits to be resolved by the decoder.

B. Improved Divider Using Symmetrical Ratio Decoders

Advantageously, the symmetrical ratio decoder defined by the equations of FIG. 6 can be used in conjunction with an improved divider circuit which can retire 4 bits of the quotient in each iteration. Such a circuit is illustrated in FIG. 7.

Figure 7B:
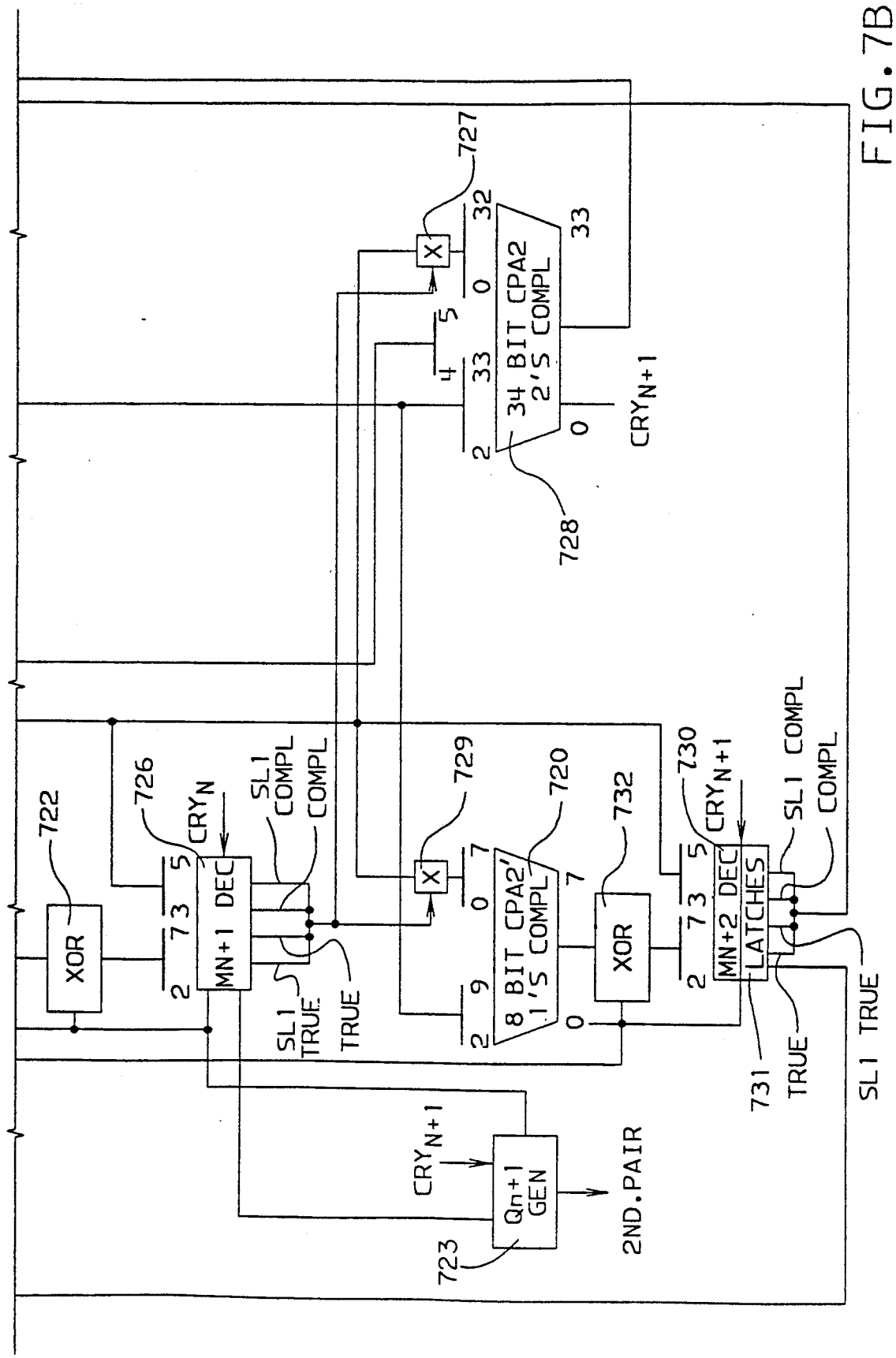

The operation of the apparatus of FIG. 7 assumes a start up phase wherein a 32 bit divisor is made positive and normalized to the form 001XX ... X. The Divisor register (W-REG) 702 holds the normalized divisor. A significant bit overflow trigger 704 holds the least significant bit (bit 31) of the original divisor in cases where the divisor has been normalized by a right shift of 1. For example, where the original divisor is 01XX ... 01; a right shift of 1 is performed to normalize to the form 001XX ... X and the overflow trigger is set to 1.

As an additional part of the start up phase, a 64 bit fixed point dividend is made positive and normalized (i.e. shifted by the same amount and in the same direction as the divisor). The 32 higher order bits of the dividend are held in the High Order Dividend register (H-REG) 706. The low order 32 bits of the dividend are held in the Low Order Dividend register (L-REG) 710. The H-REG and L-REG each include two overflow triggers 708, 712. The L-REG overflow triggers 712 are used during start up when the divisor is the maximum negative number and requires a right shift of two, or when the divisor is a positive number of the form 01XX ... X and requires a right shift of one. The H-REG overflow triggers 708 are used to hold the low order 2 bits from CPA2 728, thus making the H-REG 706,708 effectively a 34 bit register.

Once initialized, the apparatus of FIG. 7 commences generation of the quotient at the rate of 4 bits (2 pairs) per iteration. The initial quotient pair is generated by a first quotient generator (Qn-GEN) 714. To generate the initial quotient pair, the multiple Mn is decoded in a first symmetrical ratio decoder 716 from H-REG bits 2-7 and from W-REG bits 3-5. A first set of multiple gates 717 provides any of the 2's complimented divisor, the 2's complimented divisor shifted left 1 (SL1), or the 2's compliment of zero to a first 34 bit CPA (CPA1) 718 depending on the value of Mn provided by the Mn decoder 716. The first 34 bit CPA then adds the value so provided to the shifted left 2 (SL2) normalized dividend.

The specific relationship between Mn and the operation of the 34 bit carry propagate adder 718 is illustrated in Table III, below:

TABLE III

| Mn | Operation of 32 bit CPA1 |
|---|---|
| 0 | subtract 2's compliment of 0 (forces carry out CRYn from CPA1' 718) |
| 1 | subtract divisor |
| 2 | subtract divisor shifted left one. |

It should be understood that during cycles, other than the first, the multiple gates 717, 725 can also provide the complimented divisor or the complimented divisor SL1 when the carry $CRY_{n+1}=0$. However, because a subtraction must occur on the first cycle, a carry is assumed (for the first cycle only). Thus, this factor is not considered in Table III.

The carry out (CRYn) from CPA1 718 and the most significant bit of the result (sumbit0) from an eight bit carry propagate adder (CPA2') 720 are used by quotient generator 714 to determine the first two bits of the quotient from the decoded multiple. As explained with reference to the embodiment of FIG. 3, sumbit0 is indicative of the actual sign of the multiple (which is provided only in absolute form by the symmetrical ratio decoders).

For the determination of the initial two quotient bits, sumbit0 is set to 0. This is because CPA2' 720 does not play a role in the determination of these bits and because the first multiple Mn will always be positive by virtue of the fact the normalized dividend is initially made positive. For subsequent cycles, sumbit0 is latched from the 8 bit adder 720 into the Mn+2 decoder/latches 730 and fed back into the first quotient generator 714. The generation of quotient bits by the first quotient generator 714 is illustrated in Table IV below:

TABLE IV

| Decoded Multiple | Generated Quotient Bits |
|---|---|
| Where, $CRY_n = 1$ (carry out) and sumbit 0 = 0: | |
| $M_n = 0$ | $Q_n = 00$ |
| $M_n = 1$ | $Q_n = 01$ |
| $M_n = 2$ | $Q_n = 10$ |
| Where, $CRY_n = 0$ (no carry) and sumbit 0 = 0: | |
| $M_n = 0$ | $Q_n = 11$ |
| $M_n = 1$ | $Q_n = 00$ |
| $M_n = 2$ | $Q_n = 01$ |
| Where, $CRY_n = 1$ and sumbit 0 = 1: | |
| $M_n = 0$ | $Q_n = 00$ |
| $M_n = 1$ | $Q_n = 11$ |
| $M_n = 2$ | $Q_n = 10$ |
| Where, $CRY_n = 0$ and sumbit 0 = 1: | |
| $M_n = 0$ | $Q_n = 11$ |
| $M_n = 1$ | $Q_n = 10$ |
| $M_n = 2$ | $Q_n = 01$ |

In parallel with the operation of CPA1 718, an 8 bit carry propagate adder (CPA1') 724 subtracts from the SL2 high order 8 bits of the dividend by adding to it, the 1's compliment or SL1 1's compliment of the high order 8 bits of the divisor (from the W-REG 702). Again the proper value for presentation to the adder 720 is selected by the Mn decoder 716 which provides a select input to a second set of multiple gates 725. Sum bits 2 through 7 out of CPA1' 724 represent an approximate partial dividend PD'. Sum bit 0 (sumbit0) is the most significant bit out of CPA1' and represents the sign of the result.

Sumbit0 out of CPA1' 720 is exclusive OR'ed (at the XOR gates 722) with bits 2 through 7 from CPA1' 724. As described with reference to FIG. 5, the XOR gates determine whether these bits are sent to the decoder in true or 1's compliment form. Sumbit0=1 indicates that sum bits 2:7 out of the first eight bit CPA 724 need to be ones complimented before being used by a second multiple decoder (the Mn+1 decoder) 726. Sumbit0=0 out of CPA1' 724 indicates that sum bits 2 through 7 can be used as they are by the Mn+1 decoder 724. High order bits 3 through 5 of the divisor are also provided to the multiple decoder 724 from the W-REG 702 (PD'/D' where D' is the partial divisor).

The multiple generated by the Mn+1 decoder 726 and the carry out of CPA1 718 (CRYn), are input to a third set of multiple gates 727, where they select any of the true, SL1 true, or the 2's compliment of the divisor or SL1 divisor for provision to CPA2 728. CPA2 728 adds the value so provided from the SL2 remainder from CPA1 718.

The operation of CPA2 is described in Table V, below:

TABLE V

| Mn | | CRYn | Operation of 32 bit CPA2 |
|---|---|---|---|
| $M_n = 0$ | AND | $CRY_n = 1$ | PD + 2's compliment of 0 (forced carry) |
| $M_n = 0$ | AND | $CRY_n = 0$ | PD + 0 |
| $M_n = 1$ | AND | $CRY_n = 1$ | PD + 2's compliment of Divisor |
| $M_n = 1$ | AND | $CRY_n = 0$ | PD + Divisor |
| $M_n = 2$ | AND | $CRY_n = 1$ | PD + SL1 2's compliment of Divisor |
| $M_n = 2$ | AND | $CRY_n = 0$ | PD + SL1 Divisor |

($CRY_n = 1$ indicates a carry, $CRY_n = 0$ indicates no carry)

The multiple generated by the Mn+1 decoder 726 also combines with $CRY_{n+1}$ out of the 34 bit CPA2 728 at a second quotient generator (Qn+1 GEN) 723, which generates the second quotient pair using the previously described rules. The contents of the L-REG 710, 712 are then shifted left by four (SL4) and the four quotient bits are loaded into the vacated 4 low order bit portions of the register. The 34 bit remainder out of CPA2 728 is fed to the H-REG 706,708, to be used in the next cycle.

In parallel with the operation of CPA2 728, CPA2' 720 takes the high order 8 bits of the remainder SL2 out of CPA1 718 and adds the high order 8 bits of the W-REG 702 true or SL1 true or complimented or SL1 compliment in accordance with multiple generated by the Mn+1 decoder 726. Once again, the multiple selected by the Mn+1 decoder 726 is provided to CPA2' 720 by a fourth set of multiple gates 729.

Sum bits 2 through 7 out of CPA2' 720 represent an approximate partial dividend PD'; sum bit 0 represents the sign bit. As described with reference to FIG. 5, a second set of exclusive or gates 732 use sumbit0 to correct for the fact that the multiples from the Mn+2 decoder are provided only in absolute form. Again, sumbit0=1 out of 8 bit CPA2' 720 indicates that sum bits 2 though 7 out of CPA2' 720 need to be 1's complimented before being used by a third multiple decoder 730 (the Mn+2 decoder). Sumbit0=0 out of CPA2' 720 indicates that sum bits 2 through 7 out of CPA2' 720 can be used as they are by the Mn+2 decoder 730. High order bits 3 through 5 of the divisor (from the W-REG 702) are also provided to the Mn+2 decoder 730 in order to enable it to generate the next multiple.

The multiple generated by the Mn+2 decoder 730, bit0 of the sum (sumbit0) from CPA2' 730, and the carry out ($CRY_{n+1}$) from CPA2 728 are latched up in the Mn+2 decoder latches 731 to be used in the next cycle. The multiple latched in the Mn+2 decoder 730 and the latched CRYn+1 will determine the either add the true divisor, SL1 true divisor, 2's compliment divisor, or SL1 2's compliment divisor to the SL2 remainder from H-REG 706, 708 for the next divide iteration.

The first quotient pair in the next divide iteration and the following iterative cycles is determined from the latched multiple and the latched sumbit0 (as latched in the Mn+2 decoder latches 731) and the carry out $CRY_n$ of CPA1 718.

As an alternative to loading the quotient bits into vacated potions of the L-REG 710, 712, the quotient can be loaded into a separate quotient register. As is conventional, the register which holds the quotient can be provided with logic to detect fixed point divide exceptions, which are, in turn, reported to the system by way of an interrupt.

C. Divide and CVB Using Common Data Path to Halve Execution Time

Advantageously, the two cascaded 34 bit adders 718, 728 of FIG. 7 can be shared with a covert to binary (CVB) circuit. By using a common data path for the divide and CVB instructions a significant amount of chip logic and real estate can be saved. Further, the number of chip crossings, along with respective time loss, can be reduced. Advantageously, the use of the two cascaded adders cuts in half the execution time of CVB (from 16 to 8 cycles) and cuts the execution time of the divide (from 28 to 13 cycles).

The convert to binary instruction will now be explained by reference to FIG. 8. Convert to binary (CVB) is an instruction that converts decimal digits expressed in binary form, into a binary number. For example, a decimal number expressed in sixteen digits (15 representing the number, 1 representing the sign of the number) can be converted into a 32 bit binary word.

The high order 32 bit word 802 of a double word of decimal digits are provided to the CVB circuit from a general purpose register. In the high order 32 bit word 802, 8 decimal digits are each represented by 4 bits. In the low order 32 bit word (not shown), 7 decimal digits are represented by 4 bits each and the lower order 4 bits represent the sign of the decimal number.

Figure 8:
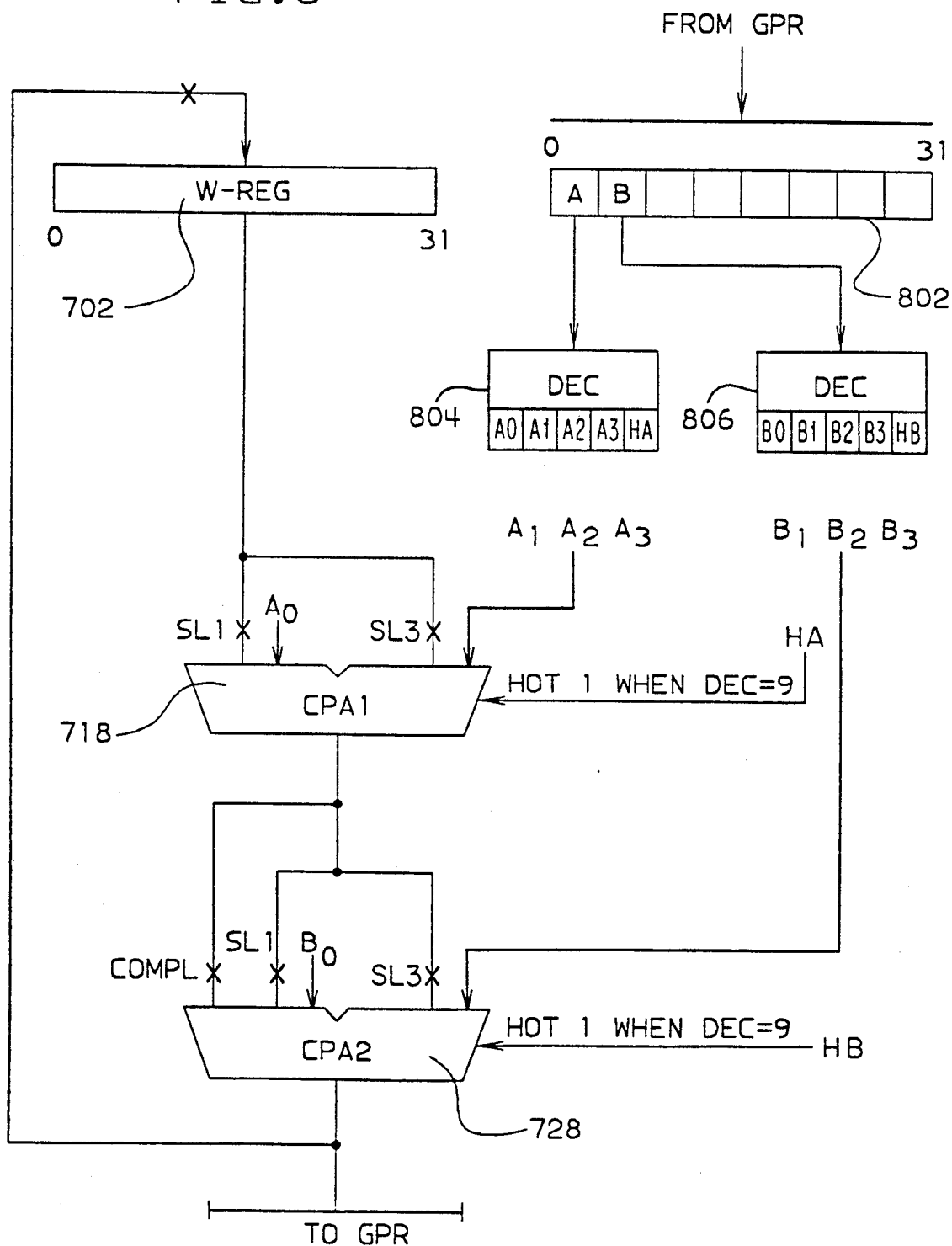
FIG. 8 illustrates and embodiment of a convert to binary circuit suitable for sharing a common data path with the apparatus of FIG. 7A/B.

As illustrated in FIG. 8, the high order decimal digit (A) defined by bits 0-3 of the high order 32 bit word is decoded, by a first decoder 804, and the results of the decode are sent to CPA1 718. A second decoder 806 decodes the second decimal digit (B), defined by bits 4-7 of the high order 32 bit word, and sends the results of the decode to CPA2 728 (into the positions vacated by the SL1 and SL3 of the output from CPA1 718). The output from CPA2, which is the binary number of the first two converted decimal digits, is then latched into the W-REG 702.

The conversion continues by wire shifting the contents of the W-REG 702 left by one (SL1) and left 3 (SL3) to CPA1 and adding the decodes of the next decimal digits into the vacated bit positions of the respective carry propagate adders. The SL1 and SL3 addition of the converted number constitutes a multiplication by 10.

The most significant bit (bit 0) of each decimal digit is gated directly to the left side of the corresponding carry propagate adder 718, 728 (e.g. CPA1 718 receives bit A0 of decimal digit A and CPA2 receives bit B0 of decimal digit B). The decoders 804, 806 produce the remaining three bits of each digit from the 4 original bits and gates them to the right side of the corresponding carry propagate adder. Where the decimal digit is an 8 (1000 bin), the decoder outputs "111" for bits 1-3 (e.g. A1-A3 or B1-B3). Where the decimal digit is a "9" (1001 bin), the decoder outputs "111" (the same as for decimal digit 8) and also adds a hot 1 to the corresponding carry propagate adder. The lower order three bits of all other decimal numbers (0000-0111 binary) are gated through to the carry propagate adders, from the decoders, in their original form.

The least significant decimal digit (LSD) in the double word indicates the sign of the decimal number. A negative number is indicated by a hexidecimal digit value of B or D. A hexidecimal digit value A, C, E or F indicates a positive number. Circuitry can also be added to signal a data exception when the least significant digit is less then 10 (A hex.). For a negative number (LSD=B or D) the result from CPA1 is provided to CPA2 in 2's compliment form. Where the decimal number is positive (LSD=A, C, E or F) the result from CPA1 is provided to CPA2 in complement form.

It should be understood that in the above-described embodiment, decimal digits other than the LSD should never be greater then 9. Circuitry can also be added to signal a data exception when this condition occurs (i.e. a digit, other than the LSD, is greater than 9).

Using two cascaded carry propagate adders enables conversion of two decimal digits per cycle (8 cycles for a decimal number expressed in 16 digits).

D. Reduced Execution Time Convert to Binary

Figure 9:
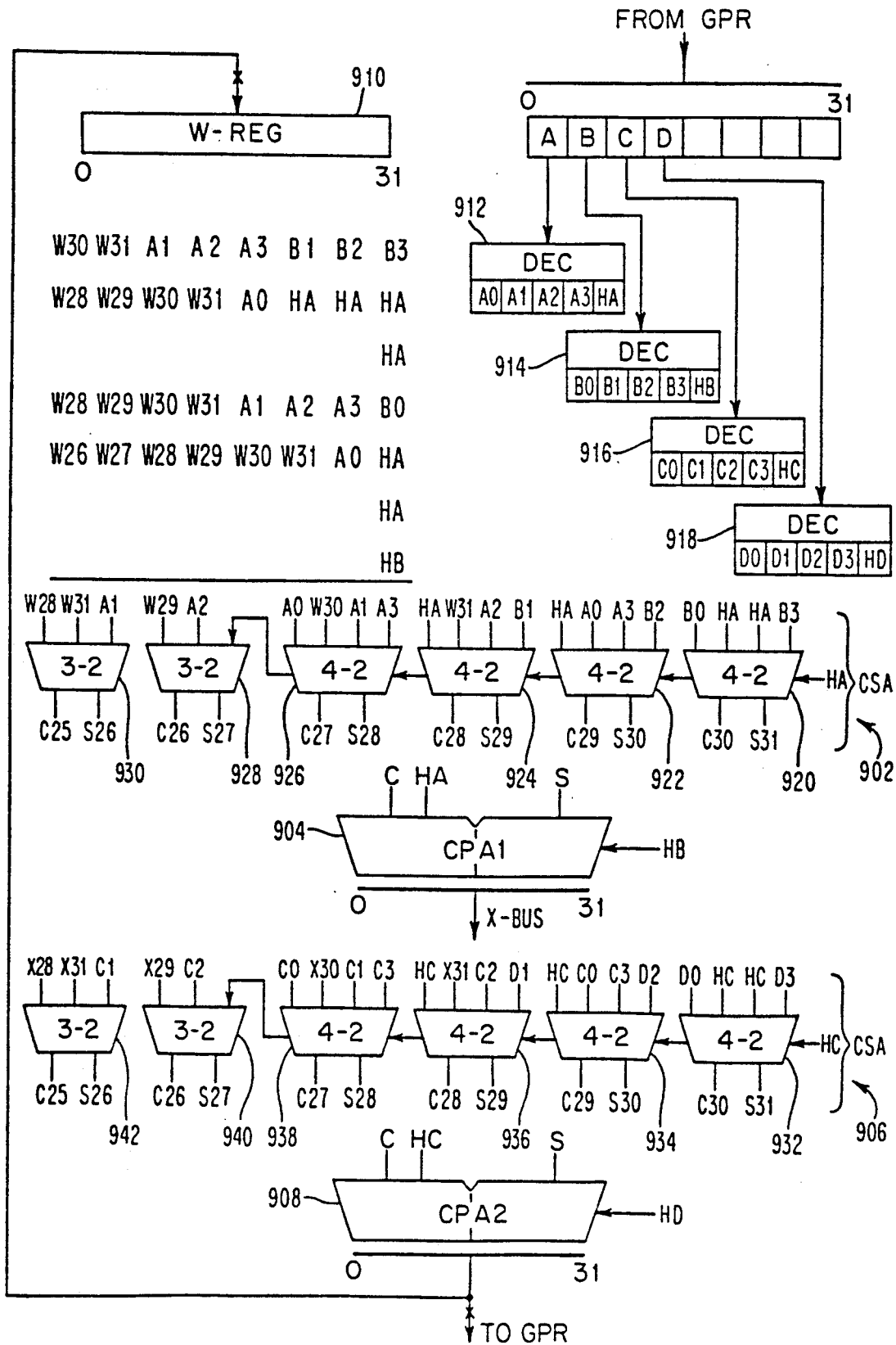
FIG. 9 illustrates another embodiment of a convert to binary circuit which can retire a 64 bit double word of decimal digits in four cycles.

Another embodiment of a convert to binary circuit which reduces the execution time of a CVB operation to 4 cycles is illustrated in FIG. 9. Like the circuit of FIG. 8, the circuit of FIG. 9 converts a 15 digit+1 sign digit decimal number to binary form, examining the decimal digits from left to right (most significant to least significant).

The apparatus of FIG. 9 converts a first pair of decimal digits in the double word through a first carry save adder 902 and a first carry propagate adder 904, and converts a second pair of decimal digits in the double word through a second CSA/CPA pair 906, 908 before the converted number is latched up in a register (W-REG) 910. In FIG. 9, the decimal digits in each group of four (two pairs) are represented by letters A through D.

Like the W-REG 702 of FIG. 8, the W-REG 910 is a 32 bit register. In FIG. 9, the 32 bits of the W-REG 910 are indicated by W0-W31 (with W0 being the MSB). In order to have access to the correct bits of four decimal digits at a time and the correct hot one values (HA-HD), the circuit of FIG. 9 uses four decoders 912-918 which operate in a similar manner to the decoders 804, 806 of the embodiment of FIG. 8.

Each of the carry save adders 902, 906 comprises four 4-2 CSAs (920-926 and 932-938 respectively) and twenty eight 3-2 CSA (of the type designated by reference numerals 928, 930, 940, 942). The 4-2 CSAs handle addition for the first four columns of addition (as described below). The 3-2 CSAs handle the addition for the remaining columns. An example of a 4-2 CSA and a single level CSA tree is illustrated in IBM Technical Disclosure Bulletin Vol. 23, No. 8, January 1989, Pp. 3811-3814, entitled "4-2 Carry-Save Adder Module", which is incorporated by reference.

The CVB method used by the apparatus of FIG. 9 is similar to that of FIG. 8 except that more quantities are added to get a binary result. As with the CVB circuit of FIG. 8, the first converted binary number (generated by CPA1 718 in the embodiment of FIG. 8) is defined by formula 1, as follows:

(formula 1)

```
    W3 ... W30 W31  A1  A2  A3
+
    W1 ... W28 W29 W30 W31  A0
+
                              HA
    ─────────────────────────────
    FIRST CONVERTED NUMBER
```

Further, like CPA1/CPA2 718 of FIG. 8, the first CSA/CPA pair 902, 904 of the embodiment of FIG. 9 generates the first two converted numbers as follows:

(formula 2)

```
        (FIRST CONVERTED NUMBER) B1 B2 B3
+
            (FIRST CONVERTED NUMBER) B0
+
                                      HB
    ─────────────────────────────────────
    (FIRST AND SECOND CONVERTED NUMBER)
``` by substitution of formula 1 for the first converted number, formula 2 becomes:

(formula 3)

```
    W3 ... W30 W31  A1  A2  A3  B1  B2  B3
+
    W1 ... W28 W29 W30 W31  A0
+
                              HA
+
    W3 .  .  .  .  . W30 W31  A1  A2  A3  B0
+
    W1 .  .  .  .  . W28 W29 W30 W31  A0
+
                                      HA
+
                                          HB
    ─────────────────────────────────────────
    (FIRST AND SECOND CONVERTED NUMBER)
```

For digit A, SL1 and SL3 of the W-REG 910 and the correct bits of digit A from the first decoder 912 and HA from the decoder 912 are added together. For digit B, SL1 and SL3 of the first converted digit A and the correct bits of digit B from the second decoder 914 and HB from the decoder 914 are added together.

To make the addition more efficient, the hot 1 (HA) from the first digit is moved to the first column and three HAs are added to row 2. Also, an HA is added to row 5 (see below).

| COLUMN | 8 | 7 | 6 | 5 | 4 | 3 | 2 | 1 | ROW |
|---|---|---|---|---|---|---|---|---|---|
| ... | W30 | W31 | A1 | A2 | A3 | B1 | B2 | B3 | 1 |
| + | | | | | | | | | |
| ... | W28 | W29 | W30 | W31 | A0 | HA | HA | HA | 2 |
| + | | | | | | | | | |
| | | | | | | | | HA | 3 |
| + | | | | | | | | | |
| ... | W28 | W29 | W30 | W31 | A1 | A2 | A3 | B0 | 4 |
| + | | | | | | | | | |
| ... | W26 | W27 | W28 | W29 | W30 | W31 | A0 | HA | 5 |
| + | | | | | | | | | |
| | | | | | | | | HA | 6 |
| + | | | | | | | | | |
| | | | | | | | | HB | 7 |

(FIRST 2 DECIMAL NUMBERS CONVERTED TO BINARY)

To accomplish the above addition, a 4-2 CSA 920-926 is used for each of the first 4 columns and a 3-2 CSA 928, 930 is used for each column after the 4th.

Column 1 is added by a 4-2 CSA 920. The five inputs are row1 through row5. Row 6 is added in bit position 31 of the left side of CPA1 904. Row 7 is added as the carry in (hot 1) to CPA1 904.

One row is eliminated after column 4 since row 2 and row 4 are equal at that point. Row 2 and row 4 can be combined into one row (starting at column 5) if from column 5 the bits are shifted left by one position (equivalent to doubling).

In FIG. 9, the first Carry Save Adder 902 adds the respective columns to produce a sum and a carry. The first carry propagate adder 904 adds the sums and carries from the first carry save adder 902.

The above described process continues for the second pair of decimal digits (C,D), as the output X-bus from CPA1 replaces the W-bits with X-Bits for use by the second carry save adder 906. Similarly, in the second CSA/CPA pair, the A-digit is replaced by the C-digit and B-digit is replaced by D-digit. The sum out of CPA2 908 is latched in the W-REG, to be used in the next cycle wherein the next two pairs of decimal digits are converted.

When the last 4 digits ABCD in the doubleword are decoded, the conversion proceeds differently. The A and B digits are converted (as before) through the first CSA 902 and the first CPA 904. Digit C is the last data digit to be converted. Digit C is converted by taking the output of the first CPA 904 and shifting it left 1 and left 3 through the second CPA 908. The decode for digit C is then inserted into the corresponding vacated bit positions (as was done in the embodiment of FIG. 8 with CPA2 728, for example). The second CSA 906 does not participate.

The last digit of the doubleword is the sign digit. If the sign digit is positive;(i.e. not hex B and not hex C) the output of the second CPA 908 is the final result and put away in the general purpose register. If the sign digit is negative, the output of the second CPA 908 is put into the W-REG 910. An extra cycle is added to 2's compliment the contents of the W-REG 910 (via the second CPA 910) before the resulting signed converted number is sent to the general purpose register.

Many variations and modifications which do not depart from the scope and spirit of the invention will now become apparent to those of skill in the art. Thus, it should be understood that the above described embodiments have been provided by way of example rather than as a limitation.

Having thus described our invention, what we declare as new and desire to secure by Letters Patent is:

1. In a non-restoring binary divider circuit of a type wherein a partial remainder is produced by subtracting a multiple of a divisor from a partial divident, a unified ratio decoder for both positive and negative values of said partial remainder, said unified ratio decoder comprising logic means for receiving said partial remainder and at least a higher order portion of said divisor and for determining a decoded multiple from said partial remainder and said partial divisor, said logic means comprising means, connected to receive said partial remainder and said partial divisor, for decoding a subset of values of said partial remainder and said partial divisor, resulting in no more than five decoded multiples which are dependant upon a sign of said partial remainder.

2. A ratio decoder for use in a circuit for performing non-restoring binary division, of a type wherein a partial remainder is produced by subtracting a multiple of a divisor from a partial dividend, comprising:

first input means for receiving a first operand of a form 1xyz, wherein xyz represent consecutive bits following a most significant 1 of the divisor;

second input means for receiving a second operand of a form abcdef, wherein abcdef represent, six consecutive high order bits of the partial remainder after the partial remainder is shifted left by two positions;

third input means for receiving a bit indicative of a sign (sumbit0) of said partial remainder;

first determining means for determining a multiple equal to zero (M0), said first determining means comprising first logic gate means for performing the logical operation:

$$M0 = \overline{abcd} + \overline{abc}x(e+f) + \overline{abc}eyz + \overline{abcef} \cdot$$
$$(x+y+z) + \overline{abce} \cdot \text{sumbit0}=1 \cdot y + \overline{abcef} \cdot \text{submit0}=1;$$

second determining means for determining a multiple equal to 2 (M2), said second determining means comprising second logic gate means for performing the logical operation:

$$M2 = a + bc + be\bar{x} + bf\bar{x} + bdef + bd(\bar{x}+\bar{y}) +$$
$$bde(\bar{y}+\bar{z}) + befyz + b\bar{x}(\bar{y}+\bar{z}) + cde\bar{x}\bar{y}\bar{z} +$$
$$cdf\bar{x}\bar{y}\bar{z} + cdef\bar{x}\bar{y} + \overline{cd\,\text{sumbit0}=1}\,\bar{x}\,\bar{y}\bar{z} +$$
$$\overline{cdef\,\text{sumbit0}=1}\,\bar{x}(\bar{y}+\bar{z}) + \overline{cde\,\text{sumbit0}=1}\,\bar{x}\bar{y}; \text{ and}$$

third determining means for determining a multiple equal to 1 (M1), said third determining means comprising third logic gate means for performing the logical operation:

$$M1 = \overline{M0} \cdot \overline{M2};$$

wherein sumbit0=1 indicates a negative sign of the partial remainder.

3. An apparatus for performing non-restoring division using a dividend and a divisor, comprising:

a first ratio decoder connected to receive a higher order portion of said dividend and a higher order portion of said divisor;

first and second carry propagate adders, said first carry propagate adder being coupled to said first ratio decoder and connected to receive said higher order portion of said dividend, said second carry propagate adder being cascaded with said first carry propagate adder;

third and fourth carry propagate adders, said third carry propagate adder being coupled to said first ratio decoder and being connected to receive said dividend and said divisor, said fourth carry propagate adder being cascaded with said third carry propagate adder, each of said third and fourth carry propagate adders comprising an output indicative of a carry out;

a second ratio decoder interposed between an output of said first carry propagate adder and an input of said second carry propagate adder, said second ratio decoder being connected to receive said carry out from said third carry propagate adder;

a third ratio decoder, coupled to an output of said first pair of cascaded carry propagate adders; and, quotient generation means, coupled to said first ratio decoder, said second ratio decoder, said third ratio decoder, and said third and fourth carry propagate adders, for generating a quotient responsive to said carry out from each of said third and fourth carry propagate adders and multiples generated by said first, second and third ratio decoders.

4. The apparatus of claim 3 where each of said first, second and third ratio decoders consist of a single ratio decoder.

5. An apparatus for decoding multiples from a partial remainder and a partial divisor, comprising:

determining means for determining when the partial remainder is negative;

complementing means, coupled to said determining means, for complementing a portion of said partial remainder when said partial remainder is negative; and, decoding means, coupled to said complementing means and said determining means and connected to receive said partial divisor, for producing said multiples in response to said partial remainder and said partial divisor, said decoding means comprising means for decoding no more than five of said multiples whose values are dependant upon a sign of said partial remainder.

6. The apparatus of claim 5, wherein said partial divisor is of the form 1xyz wherein xyz represent consecutive bits following a most significant 1 of the partial divisor, said partial dividend is of the form abcdef wherein abcdef represent, six consecutive high order bits of the partial remainder after the partial remainder is shifted left by two positions, said determining means comprises a bit indicative of a sign (sumbit0) of said partial remainder, and wherein said decoding means comprises:

first determining means for determining a multiple equal to zero (M0), said first determining means comprising first logic gate means for performing the logical operation:

$$M0 = \overline{abcd} + \overline{abc}x(e+f) + \overline{abc}eyz + \overline{abcef} \cdot$$
$$(x+y+z) + \overline{abce} \cdot \text{sumbit0}=1 \cdot y + \overline{abcef} \cdot \text{submit0}=1;$$

second determining means for determining a multiple equal to 2 (M2), said second determining means comprising second logic gate means for performing the logical operation:

$$M2 = a + bc + be\bar{x} + bf\bar{x} + bdef + bd(\bar{x} + \bar{y}) +$$

$$bde(\bar{y} + \bar{z}) + bef\bar{y}\bar{z} + b\bar{x}(\bar{y} + \bar{z}) + cde\bar{x}\bar{y}\bar{z} +$$

$$cdf\bar{x}\bar{y}\bar{z} + cdef\bar{x}\bar{y} + cd\overline{\text{sumbit0}=1}\,\bar{x}\,\bar{y}\,\bar{z} +$$

$$cdef\,\overline{\text{sumbit0}=1}\,\bar{x}\,(\bar{y} + \bar{z}) + cde\,\overline{\text{sumbit0}=1}\,\bar{x}\,\bar{y};\text{ and}$$

third determining means for determining a multiple equal to 1 (M1), said third determining means comprising third logic gate means for performing the logical operation:

$$M1 = \overline{M0} \cdot \overline{M2};$$

wherein sumbit0=1 indicates a negative sign of the partial remainder.

7. The apparatus of claim 5 wherein said portion of said partial remainder comprises said partial remainder shifted left by two places.

8. An apparatus for performing non-restoring binary division, comprising:
first adding means for subtracting a multiple of a normalized divisor from a normalized dividend so as to produce a difference thereof and a carry out;
second adding means for subtracting a portion of said multiple of said normalized divisor from a portion of said normalized dividend so as to produce a partial remainder and a sign-bit indicative of a sign of said partial remainder;
complementing means, connected to receive said partial remainder and said sign-bit, for EXCLUSIVE ORing a portion of said partial remainder and said sign bit so as to produce a positive partial dividend;
decoding means, coupled to said complementing means and said second adder means, for producing a positive multiple in response to said sign-bit, said normalized divisor and said positive partial dividend, said decoding means comprising means for decoding no more than five multiples whose values are dependant upon a value of said sign-bit; and
quotient determining means, connected to receive said carry out, said sign-bit and said positive multiple, for two's complement said positive multiple when said sign-bit indicates that said partial remainder was negative so as to produce a true multiple, and for subtracting said carry out from said true multiple to produce a partial quotient.

9. In an apparatus for performing non-restoring division of a type wherein a normalized partial dividend and a higher order portion of a multiple of a normalized divisor are subtracted so as to produce a partial remainder and a sign-bit indicative of a sign of said partial remainder, a ratio decoder comprising:
complementing means, connected to receive said partial remainder and said sign-bit, for EXCLUSIVE ORing a portion of said partial remainder and said sign bit so as to produce a positive partial dividend; and
decoding means, coupled to said complementing means and connected to receive said sign-bit and at least a portion of said normalized divisor, for producing a positive multiple in response to said sign-bit, said positive partial dividend and said normalized divisor, said decoding means comprising means for decoding no more than five multiples whose values are dependant upon a value of said sign-bit.

* * * * *